United States Patent
Saito et al.

(10) Patent No.: US 6,687,113 B2
(45) Date of Patent: Feb. 3, 2004

(54) ELECTROSTATIC CHUCK

(75) Inventors: Shinji Saito, Yokohama (JP); Toshihiko Hanamachi, Kawasaki (JP); Takashi Kayamoto, Yokohama (JP)

(73) Assignee: NHK Spring Co., Ltd., Yokohama (JP)

( * ) Notice: Subject to any disclaimer, the term of this patent is extended or adjusted under 35 U.S.C. 154(b) by 35 days.

(21) Appl. No.: 09/840,691

(22) Filed: Apr. 20, 2001

(65) Prior Publication Data

US 2001/0055190 A1 Dec. 27, 2001

(30) Foreign Application Priority Data

Apr. 27, 2000 (JP) .................................. 2000-127810

(51) Int. Cl.$^7$ ................................................ B23B 31/28
(52) U.S. Cl. .......................... 361/234; 361/233; 279/128
(58) Field of Search ................ 361/233, 234; 279/128

(56) References Cited

U.S. PATENT DOCUMENTS

| | | | | |
|---|---|---|---|---|
| 5,426,558 A | * | 6/1995 | Sherman | 361/234 |
| 5,456,757 A | | 10/1995 | Aruga et al. | |
| 5,633,073 A | | 5/1997 | Cheung et al. | |
| 5,665,166 A | | 9/1997 | Deguchi et al. | |
| 5,766,364 A | | 6/1998 | Ishida et al. | |
| 5,880,924 A | * | 3/1999 | Kumar et al. | 361/234 |
| 5,958,813 A | * | 9/1999 | Aida et al. | 501/98.4 |
| 6,108,189 A | * | 8/2000 | Weldon et al. | 361/234 |
| 6,529,362 B2 | * | 3/2003 | Herchen | 361/234 |

FOREIGN PATENT DOCUMENTS

JP  11-260534  9/1999

OTHER PUBLICATIONS

U.S. Ser. No. 09/299,807 Layered Ceramic/Metallic Assembly and an Electrostatic Chuck Using Such an Assembly Technical Field.
U.S. Ser. No. 09/814,277 Ceramic Heater Device and Film Forming Device Using the Same.
U.S. Ser. No. 09/847,844 Filing Date: May 1, 2001 Toshihiro Tachikawa and Toshihiko Hanamachi Heating Apparatus.

* cited by examiner

Primary Examiner—Brian Sircus
Assistant Examiner—Isabel Rodriguez
(74) Attorney, Agent, or Firm—Frishauf, Holtz, Goodman & Chick, P.C.

(57) ABSTRACT

An electrostatic chuck comprising a ceramic chuck body having an adsorption face and an electrode for applying a potential to the adsorption face, the chuck body including a ceramic consisting mainly of MgO. The ceramic that consists mainly of MgO is doped with one or more additives selected from a group including TiC, $TiO_2$, $ZrO_2$, $V_2O_5$, $Nb_2O_5$, $Ta_2O_5$, $Co_3O_4$, $Cr_2O_3$, and NiO so that its electrical resistivity in a working temperature region ranges from $1\times10^8$ to $1\times10^{12}$ $\Omega\cdot cm$. This electrostatic chuck is highly resistant to a corrosive environment such as fluoride plasma.

2 Claims, 1 Drawing Sheet

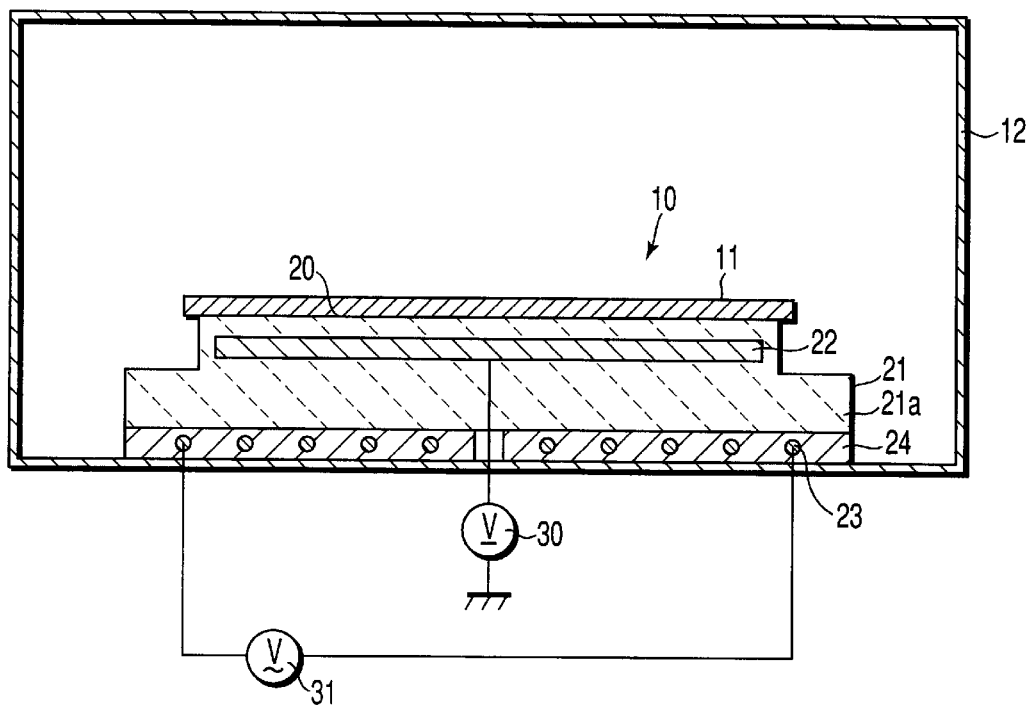
FIGURE

ELECTROSTATIC CHUCK

CROSS-REFERENCE TO RELATED APPLICATIONS

This application is based upon and claims the benefit of priority from the prior Japanese Patent Application No. 2000-127810, filed Apr. 27, 2000, the entire contents of which are incorporated herein by reference.

BACKGROUND OF THE INVENTION

The present invention relates to an electrostatic chuck for holding a workpiece such as a wafer by means of an electrostatic force in a manufacturing process for a semiconductor, for example.

A mechanical chuck, vacuum chuck, electrostatic chuck, etc. are known means for holding a workpiece in position. In a semiconductor manufacturing process, for example, an electrostatic chuck that utilizes electrostatic force may sometimes be used to hold a wafer in position. In order to maintain a desired electrostatic force, an electrical insulator such as a ceramic is used as a material for the electrostatic chuck. A sintered electrostatic chuck is described in Jpn. Pat. Appln. KOKAI Publication No. 11-260534, for example. This electrostatic chuck uses a sintered ceramic material that consists mainly of alumina ($Al_2O_3$) or aluminum nitride (AlN).

In the semiconductor manufacturing process, the electrostatic chuck may sometimes be exposed to a wide range of atmospheric temperatures, from minus tens of degrees to plus hundreds of degrees centigrade. In this case, the necessary electrostatic adsorption force cannot be obtained satisfactorily with use of pure alumina or aluminum nitride, especially in the low temperature region. Accordingly, the feasible electrical conductivity ($1 \times 10^8$ to $1 \times 10^{12}$ $\Omega \cdot cm$) for the electrostatic chuck is obtained by doping alumina or aluminum nitride with traces of various oxides, nitrides, carbides, etc., thereby adjusting the composition of the ceramic. Besides the sintered electrostatic chuck, an electrostatic chuck (flame-coated electrostatic chuck) is known that is formed by flame-coating a metal substrate with the ceramic material.

In the semiconductor manufacturing process, the electrostatic chuck may sometimes be exposed to a corrosive environment that is based mainly on a fluoride plasma gas. In this case, the surface of the electrostatic chuck is corroded and its crystal grains detach, so that the wafer may be soiled or damaged.

Usually, an electrostatic chuck is fixed to a metal substrate by brazing, soldering, adhesive bonding, or mechanical clamping. However, there is a great difference in coefficient of thermal expansion between the metal substrate and a conventional ceramic electrostatic chuck. For example, the coefficient of thermal expansion of an alumina-based ceramic is about $8 \times 10^{-6}/°C$, while that of an aluminum-nitride-based ceramic is about $4 \times 10^{-6}/°C$. On the other hand, the coefficient of thermal expansion of a metal substrate of an aluminum alloy is as high as about $20 \times 10^{-6}/°C$.

Accordingly, a sudden change in temperature during the semiconductor manufacturing process causes a great difference in thermal expansion between the ceramic electrostatic chuck and the metal substrate. This difference in thermal expansion may result in deformation of the electrostatic chuck or separation or breakage of the joints between the ceramic and the metal substrate, thus constituting a hindrance to the semiconductor manufacturing process.

BRIEF SUMMARY OF THE INVENTION

Accordingly, the object of the present invention is to provide an electrostatic chuck highly resistant to corrosion and subject to only a small difference in coefficient of thermal expansion between a chuck body and a metallic member.

In order to achieve the above object, according to the present invention, there is provided an electrostatic chuck comprising a chuck body having an adsorption face capable of electrostatically adsorbing a to-be-adsorbed object, such as a semiconductor wafer, and an electrode for applying a potential to the adsorption face. The chuck body is formed of a ceramic consisting mainly of magnesium oxide (MgO) and having electrical conductivity in a working temperature region. The ceramic that consists mainly of MgO is highly resistant to corrosion in a fluoride atmosphere that is used in a semiconductor manufacturing process or the like. Since this ceramic, consisting mainly of MgO, has a coefficient of thermal expansion approximate to that of metal, the difference in thermal expansion between the ceramic and a metallic member that are coupled together is small. Since the electrostatic chuck of the invention can utilize the Johnsen-Rahbek effect, moreover, it can produce a great adsorption force in a wide temperature region that is applied to a semiconductor wafer manufacturing process, for example.

According to the invention, a ceramic that consists of MgO doped with less than 1.5% of a carbide (e.g., TiC) may be used so that required electrical resistivity ($1 \times 10^8$ to $1 \times 10^{12}$ $\Omega \cdot cm$) for the electrostatic chuck can be obtained in the working temperature region of the electrostatic chuck. Since TiC is an electrically conductive material, the electrical resistivity of the electrostatic chuck can be adjusted to the working temperature region by the addition of TiC. If 1.5% or more of TiC is added, however, the sintered density of the ceramic inevitably lowers.

According to the invention, a ceramic that consists of MgO doped with less than 5% of an oxide of a transition metal may be used so that required electrical resistivity for the electrostatic chuck can be obtained in the working temperature region of the electrostatic chuck. The oxide may be selected from a group including titanium dioxide ($TiO_2$), zirconium dioxide ($ZrO_2$), vanadium pentoxide ($V_2O_5$), niobium pentoxide ($Nb_2O_5$), tantalum pentoxide ($Ta_2O_5$), cobalt tetroxide ($Co_3O_4$), chromium trioxide ($Cr_2O_3$), etc.

$TiO_2$, $ZrO_2$, $V_2O_5$, $Nb_2O_5$, $Ta_2O_5$, $Co_3O_4$, and $Cr_2O_3$ react with MgO to form a solid solution and create electronic defects in MgO, thereby enhancing the electrical conductivity of the ceramic. Thus, the electrical resistivity of the electrostatic chuck can be adjusted to the working temperature region by adding these oxides to MgO. If 5% or more is added, however, the sintered density and corrosion resistance of the ceramic inevitably lower.

According to the present invention, moreover, MgO may be doped with less than 15% of NiO so that the required electrical resistivity for the electrostatic chuck can be obtained in the working temperature region of the electrostatic chuck. NiO also serves to form a solid solution in MgO, thereby enhancing the electrical conductivity of the ceramic. Thus, the electrical resistivity of the electrostatic chuck can be adjusted to the working temperature region by adding NiO to MgO. If 15% or more of NiO is added, however, the sintered density and corrosion resistance of the ceramic inevitably lower.

In the present invention, the chuck body may be fixed to the metallic member. According to this invention, there may be provided a high-durable electrostatic chuck comprising a metallic member and a ceramic chuck body, which cannot be deformed by a difference in thermal expansion, and in which the respective interfaces of the ceramic and the metallic member can avoid being separated or broken.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

The single FIGURE is a sectional view showing an electrostatic chuck according to an embodiment of the present invention.

DETAILED DESCRIPTION OF THE INVENTION

An embodiment of the present invention will now be described with reference to FIGURE.

An electrostatic chuck 10 shown in FIGURE is used to adsorb and hold a semiconductor wafer 11 in position by means of electrostatic force in a manufacturing process for a semiconductor, for example. The electrostatic chuck 10 is stored in a chamber 12 that can be kept airtight. If necessary, a decompression, vacuum atmosphere or specific gas atmosphere can be maintained in the chamber 12.

The electrostatic chuck 10 comprises a chuck body 21, electrode 22, heater 23, metal substrate 24, etc. The chuck body 21 is formed of a ceramic 21a that has a flat adsorption face 20 for electrostatically adsorbing the semiconductor wafer 11. The electrode 22 serves to apply an electrostatic potential to the adsorption face 20. The heater 23 is an electric heating member that heats the wafer 11 and the chuck body 21 by heat conduction. The metal substrate 24 is an example of a metallic member that is fixed to the chuck body 21. Although the illustrated electrode 22 is of a single-pole type, it may be replaced with a bipolar electrode. The electrode 22 is embedded in the chuck body 21.

The metal substrate 24 is formed of a metal such as an aluminum alloy. The substrate 24 and the chuck body 21 are fixed to each other by brazing, soldering, adhesive bonding, or mechanical clamping using bolts, for example. In the case of the electrostatic chuck 10 shown in FIGURE, the heater 23 is embedded in the substrate 24. However, the heater 23 may be embedded in the chuck body 21. Alternatively, the chuck body 21 or the like may be fitted with a heater that is formed independently of the body 21 and the substrate 24.

The electrode 22 is connected to a DC power source 30 so that a positive or negative potential can be applied to the electrode 22. A heater power source 31 is connected to the heater 23. The electrostatic chuck 10 and the wafer 11 can be heated by energizing the heater 23.

The chuck body 21 is formed of, for example, a discoid ceramic 21a that consists mainly of MgO. The composition of the ceramic 21a is adjusted so that electrical conduction from the electrode 22 to the adsorption face 20 can be ensured in the working temperature region of the electrostatic chuck 10.

TABLE 1 shows the chemical composition, electrical resistivity, and electrostatic chuck working temperature for each of the several embodiments. AS shown in TABLE 1, the electrical resistivity can be made lower than that of pure Mgo in a wide temperature region from minus tens of degrees to plus hundreds of degrees centigrade by doping MgO with infinitesimal additives such as nitrides or oxides.

In a high temperature region of about 500° C., as shown in TABLE 1, a feasible electrical conductivity and adsorption force for the chuck can be obtained even with use of a ceramic that substantially consists of MgO only. In the case where the working temperature is 200° C. or thereabout, a ceramic that consists of MgO doped with NiO is a suitable material for the chuck.

TABLE 1

| | Chemical Composition (% by volume) | | | | | | | | | | Resistivity/ Working Temperature |
|---|---|---|---|---|---|---|---|---|---|---|---|
| | Mgo | TiC | TiO$_2$ | ZrO$_2$ | V$_2$O$_5$ | Nb$_2$O$_5$ | Ta$_2$O$_5$ | Co$_3$O$_4$ | Cr$_2$O$_3$ | NiO | Ω · cm/° C. |
| 1 | 100 | — | — | — | — | — | — | — | — | — | 8 × 10$^{11}$/500 |
| 2 | Bal. | 0.5 | — | — | — | — | — | — | — | — | 2 × 10$^{11}$/400 |
| 3 | Bal. | 1.0 | — | — | — | — | — | — | — | — | 4 × 10$^{9}$/400 |
| 4 | Bal. | 0.5 | — | — | — | — | — | — | — | 1.5 | 8 × 10$^{9}$/200 |
| 5 | Bal. | — | — | — | — | — | — | — | — | 2 | 1 × 10$^{10}$/200 |
| 6 | Bal. | — | 0.5 | — | — | — | — | 1.0 | — | — | 1 × 10$^{9}$/25 |
| 7 | Bal. | 0.5 | 1.0 | — | — | — | — | — | — | — | 7 × 10$^{10}$/25 |
| 8 | Bal. | 0.5 | — | — | — | — | — | 1.0 | 0.5 | — | 3 × 10$^{8}$/25 |
| 9 | Bal. | — | — | — | — | 2.5 | — | — | — | — | 3 × 10$^{10}$/25 |
| 10 | Bal. | — | — | — | 0.5 | 1.0 | 1.5 | — | — | — | 2 × 10$^{10}$/25 |
| 11 | Bal. | 0.5 | — | — | — | — | — | — | 1.5 | — | 9 × 10$^{9}$/25 |
| 12 | Bal. | 0.5 | 2.0 | — | — | — | — | — | — | — | 7 × 10$^{9}$/25 |
| 13 | Bal. | 0.5 | 1.0 | 1.0 | — | — | — | — | — | — | 9 × 10$^{9}$/25 |
| 14 | Bal. | 0.5 | 2.0 | — | — | — | 0.5 | 2.0 | — | — | 4 × 10$^{10}$/−20 |

The wafer 11 is placed in a given position on the adsorption face 20 of the electrostatic chuck 10, and a potential from the DC power source 30 is applied to the electrode 22. This electrostatic potential produces an attraction force that is based on the polarization between the adsorption face 20 and the wafer 11 that are opposed to each other. The adsorption face 20 adsorbs the wafer 11 by means of this attraction force (electrostatic force). Further, the electrostatic potential causes charged polarization in minute irregularities on the adsorption face 20. Thus, an adsorption force based on the so-called Johnsen-Rahbek effect is produced in these minute irregularities. Since the electrostatic chuck 10 adsorbs the wafer 11 by means of the Johnsen-Rahbek effect, it can obtain a greater adsorption force than an electrostatic chuck that uses a conventional electrical insulating ceramic (and that utilizes the Coulomb force).

Since the Johnsen-Rahbek effect is an electro-static force that is based on the charged polarization in the minute irregularities on the adsorption face 20, the polarization is canceled the moment the potential is removed. When the power source 30 is switched off, therefore, the adsorption force is canceled in a short time, so that there is no possibility of the wafer 11 being left sticking to the adsorption face 20. As the Johnsen-Rahbek effect and the Coulomb force cooperate with each other, the electrostatic chuck 10 can obtain a strong electrostatic adsorption force, and the semiconductor wafer 11 can be quickly released when the power source 30 is switched off.

If necessary, the heater 23 is energized by means of the heater power source 31 to heat the electrostatic chuck 10 and the semiconductor wafer 11. In the case of a conventional electrostatic chuck that is formed of an alumina-based ceramic or aluminum-nitride-based ceramic, there is a great difference in the thermal expansion between the metal substrate and the ceramic. Thus, in a conventional electrostatic chuck, the respective joint surfaces of the metal substrate and the ceramic may be separated, or the chuck body may be deformed or broken.

The electrostatic chuck 10 according to the present invention is provided with the ceramic 21a that consists mainly of MgO. The coefficient of thermal expansion of MgO that constitutes the ceramic 21a is $13 \times 10^{-6}/°C$, which is approximate to that of a metal such as an aluminum alloy. If there is a great change in temperature, therefore, the difference in thermal expansion between the chuck body 21 and the metal substrate 24 is so small that their respective joint surfaces can avoid being separated or broken.

Even if the ceramic 21a that consists mainly of MgO is exposed to a corrosive atmosphere (mainly containing fluoride plasma gas) that is used during the semiconductor manufacturing process, it is highly resistant to the corrosive environment. Accordingly, the surface of the electrostatic chuck 10 can avoid being corroded and having its crystal grains detach, and the wafer 11 can be prevented from being soiled or damaged by the lack of crystal grains. Thus, the quality of the wafer 11 is improved.

It is to be understood, in carrying out the present invention, that the to-be-adsorbed object that is held by means of the electrostatic chuck is not limited to a wafer, and that the components that constitute the invention, including the chuck body, adsorption face, electrode, metal substrate, etc., may be variously changed or modified without departing from the scope or spirit of the invention.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. An electrostatic chuck comprising:

a chuck body having an adsorption face which electrostatically adsorbs a to-be-adsorbed object; and an electrode for applying a potential to the adsorption face;

wherein the chuck body includes a ceramic containing at least 85% MgO, doped with TiC and one or two oxides selected from the group consisting of $Co_3O_4$, $Cr_2O_3$ and NiO serving to form a solid solution, the ceramic having an electrical conductivity in a working temperature region, and wherein an adsorption force based on Johnsen-Rahbek effect is produced by charged polarization on the adsorption face when the potential is applied to the electrode.

2. An electrostatic chuck according to claim 1, wherein said chuck body is fixed to a metallic member.

* * * * *